US006490151B1

(12) United States Patent
Nelson et al.

(10) Patent No.: US 6,490,151 B1
(45) Date of Patent: Dec. 3, 2002

(54) METHOD AND SYSTEM FOR VISUALLY DIFFERENTIATING INDUSTRIAL PERSONAL COMPUTERS

(75) Inventors: Curtis R. Nelson, Cedar Rapids, IA (US); Craig J. Jensen, Cedar Rapids, IA (US); John R. Bodensteiner, Cedar Rapids, IA (US)

(73) Assignee: Crystal Group Inc., Hiawatha, IA (US)

( * ) Notice: Subject to any disclaimer, the term of this patent is extended or adjusted under 35 U.S.C. 154(b) by 193 days.

(21) Appl. No.: 09/648,323

(22) Filed: Aug. 25, 2000

(51) Int. Cl.[7] .................................................. G06F 1/16

(52) U.S. Cl. ........................ 361/683; 361/724; 361/725; D14/444; 312/223.2

(58) Field of Search ................................. 361/683, 686, 361/724–727; D14/444; 312/223.1, 223.2

(56) References Cited

U.S. PATENT DOCUMENTS

| 4,215,386 | A | * | 7/1980 | Prager et al. ................ 361/683 |
| 5,547,272 | A | * | 8/1996 | Paterson et al. ............. 361/683 |
| 5,604,662 | A | * | 2/1997 | Anderson et al. ............ 361/727 |
| 5,661,631 | A | * | 8/1997 | Crane, Jr. .................... 361/683 |
| 5,896,273 | A | * | 4/1999 | Varghese et al. ............ 361/724 |
| 6,181,549 | B1 | * | 1/2001 | Mills et al. .................. 361/683 |
| 6,259,605 | B1 | * | 7/2001 | Schmitt ....................... 361/727 |
| 6,311,229 | B1 | * | 10/2001 | Burchard et al. ........... 361/724 |

* cited by examiner

*Primary Examiner*—Darren Schuberg
*Assistant Examiner*—Lisa Lea-Edmonds
(74) *Attorney, Agent, or Firm*—Simmons, Perrine, Albright & Ellwood, P.L.C.

(57) ABSTRACT

A system and method for visually differentiating an industrial PC including a color-coded removable rigid differentiation plate disposed on the front side of the industrial PC. The removable rigid differentiation plate is non-adhesive and is mechanically coupled to the faceplate.

7 Claims, 4 Drawing Sheets

METHOD AND SYSTEM FOR VISUALLY DIFFERENTIATING INDUSTRIAL PERSONAL COMPUTERS

FIELD OF THE INVENTION

The present invention generally relates to computers, and more particularly relates to personal computers, and even more particularly relates to methods and systems for visually differentiating industrial personal computers.

BACKGROUND OF THE INVENTION

In recent years, industrial personal computers have become increasingly prevalent in many industries. It is not uncommon today to see rows of industrial PCs arranged in racks. While many of these industrial PCs are often designed and manufactured to higher standards than consumer PCs, they still are occasionally in need of repair. Typically, when a repair is needed, the PC is removed from the rack, taken to a computer repair facility, and repaired. However, the task of identifying the correct PC to be removed is often not a trivial task. With row upon row of virtually identically appearing PCs in floor to ceiling racks, it often is difficult to rapidly ascertain even the general area that a PC might be located. In the past, to address this problem, some industrial PC users have applied adhesive labels on the front panels of the PC, giving identifying information.

While these adhesive labels may have been used extensively in the past, they do have some drawbacks. First of all, they are prone to becoming detached from the PC. This can happen as a result of contact with persons moving about the racks or because of degradation of the adhesive bond.

Consequently, there exists a need for improved methods and systems for visually differentiating personal computers in a rack in an efficient manner.

SUMMARY OF THE INVENTION

It is an object of the present invention to provide a system and method for visually differentiating an industrial personal computer in an efficient manner.

It is a feature of the present invention to utilize a non-adhesive removable rigid visual differentiation plate.

It is another feature to provide the removable rigid visual differentiation plate in a color which is dissimilar from a color of the faceplate of the PC.

It is yet another feature of the present invention to provide a plurality of dissimilar colors for said removable rigid visual differentiation plates and to associate PC having common functional characteristics to a particular color.

It is yet another feature of the present invention to include a removal tool for assisting in rapid removal of the removable rigid visual differentiation plate.

It is an advantage of the present invention to achieve improved efficiency in differentiating industrial personal computers disposed in racks.

The present invention is an apparatus and method for visually differentiating industrial personal computers designed to satisfy the aforementioned needs, provide the previously stated objects, include the above-listed features, and achieve the already articulated advantages. The present invention is carried out in an "unintentional removal-less" manner in a sense that the accidental or otherwise unintentional removal of a visual differentiation plate due to a failure in an adhesive bond has been eliminated.

Accordingly, the present invention is a mechanical system and method including a non-adhesive removable rigid visual differentiation plate on a faceplate of an industrial computer.

BRIEF DESCRIPTION OF THE DRAWINGS

The invention may be more fully understood by reading the following description of the preferred embodiments of the invention, in conjunction with the appended drawings wherein.

DETAILED DESCRIPTION

Figure 1:
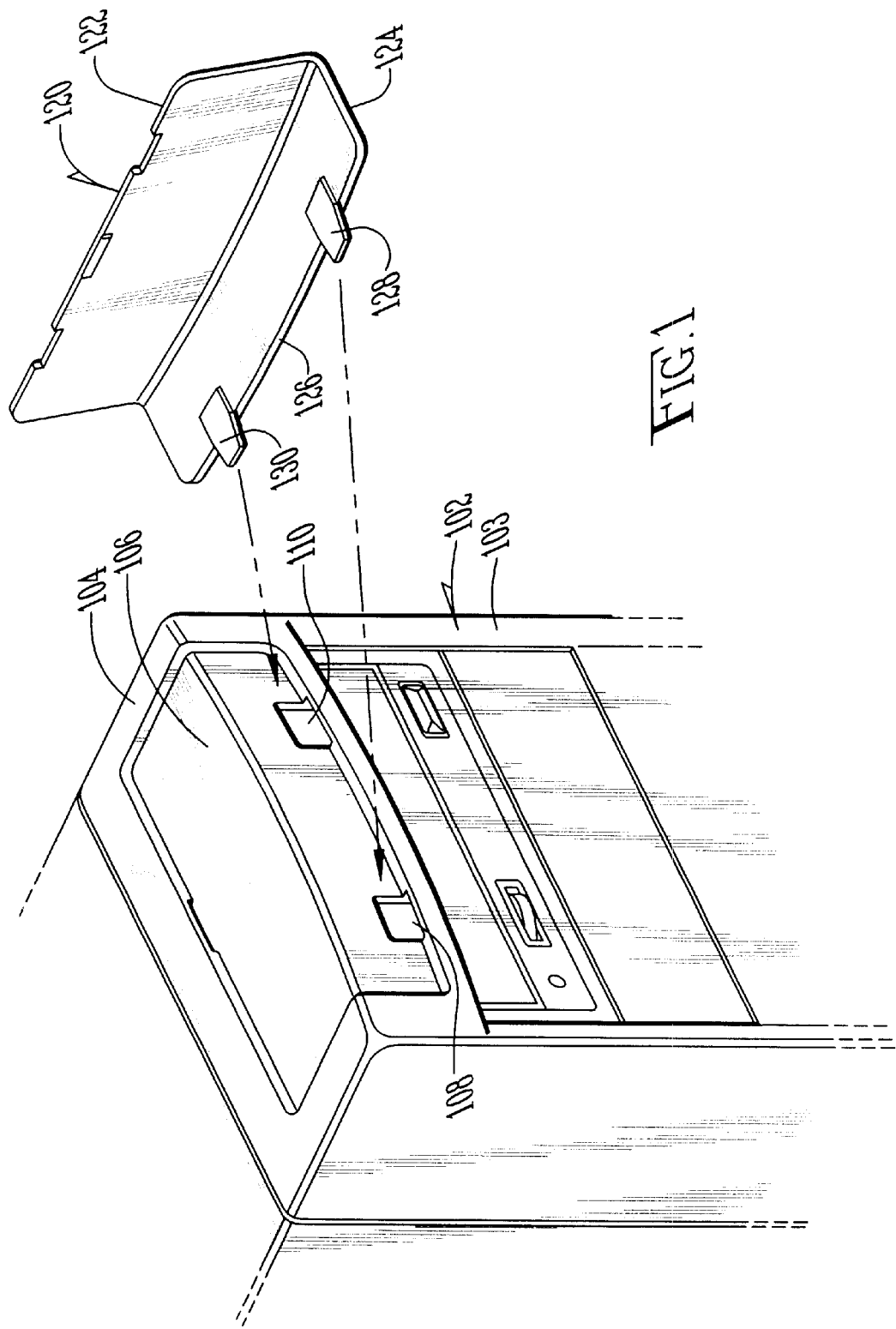
FIG. 1 is an exploded perspective view of a system of the present invention.

Now referring to the drawings wherein like numerals refer to like matter throughout, and more specifically referring to FIG. 1, there is shown a system of the present invention, including an industrial PC faceplate 102, having a front faceplate side 103, a top faceplate side 104, a differentiation plate void 106, having ear receiving voids 108 and 110.

Throughout this description, the term "industrial PC" is used to represent a PC of the type which is capable of being stored in racks of multiple rows of PCs, where each row has multiple PCs and where the PCs are coupled to wiring associated with the rack and other equipment by at least one connector at the rear end of the PC. This definition of industrial PCs is not intended to include laptop PCs which have a connector on the rear end of the laptop for coupling with a docking station or a port replicator. Consequently, the term "industrial PC" will specifically exclude any computer where the width dimension w is greater than three times the height dimension d and shall not include any PC which has along its top side a hinged display screen hinged along the rear end of the PC.

Voids 108 and 110 are for receiving therein ears 128 and 130 respectively. Ears 128 and 130 are disposed on a bottom edge 126 of front side 124 of differentiation plate 120, which has a top side 122. Front side 124 and top side 122 are substantially orthogonal with respect to each other. The dashed lines show how the ears 128 and 130 fit into voids 108 and 110, respectively. Preferably the colors of faceplate 102 and differentiation plate 120 are of dissimilar colors. In one embodiment, the front side 124 and the top side 122 are made of smooth surface for assisting in handwriting information on with a permanent marker or other writing instrument. In another embodiment, the front side 124 and the top side 122 can be manufactured with information displayed thereon for assisting in differentiating one PC from another. Preferably, differentiation plate 120 is a single rigid piece of ABS plastic, which is preferably of the same material, but need not be, as faceplate 102.

Figure 2:
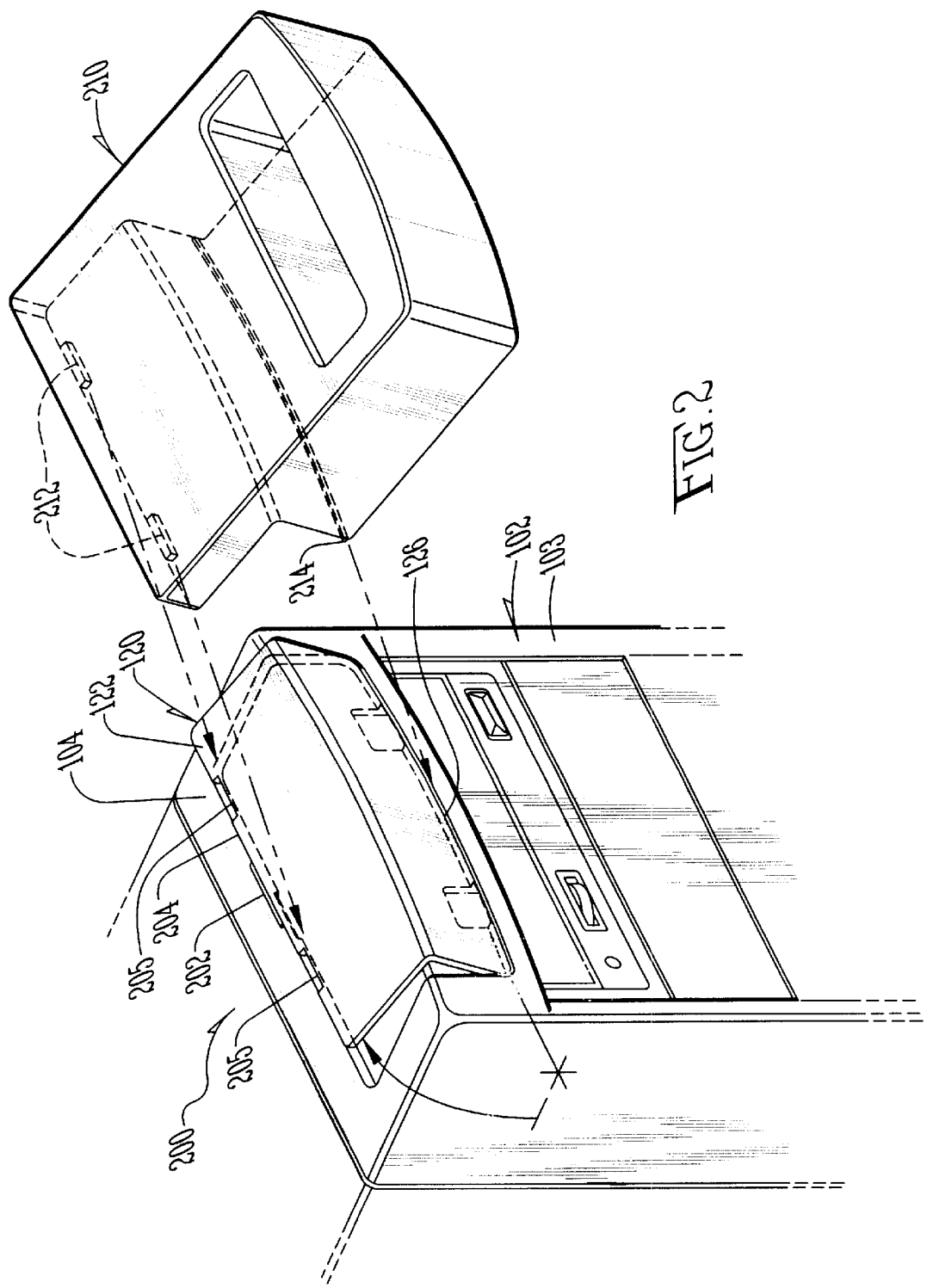
FIG. 2 is a perspective view of the system of FIG. 1, showing a removal tool being used to assist in the removal of the differentiation plate.

Now referring to FIG. 2, there is shown, in a partially exploded view, a system of the present invention, generally designated 200, including a faceplate 102 and a differentiation plate removal tool 210. Differentiation plate 120 is shown positioned at a midpoint in the removal process. Top side 122 has a thin lip region 202 disposed along its back edge 204. Top side 122 has been pivoted around bottom edge 126 by a downward pressure applied by tool 210 (which is shown in an exploded relationship with plate 120). Removal tool 210 includes a front protuberance 212, which is preferably adapted to fit into a top gap 205 (FIG. 3) formed between top side 122 and top faceplate side 104, along a point above the thin lip region 202 which is partially disposed under the top surface of top faceplate side 104, when plate 120 is in a final fixed position. Additionally, tool 210 includes a fulcrum protuberance 214, for controlling a pivot point of the plate 120 during the removal process. Preferably, tool 210 is a rigid member made of milled aluminum.

Figure 3:
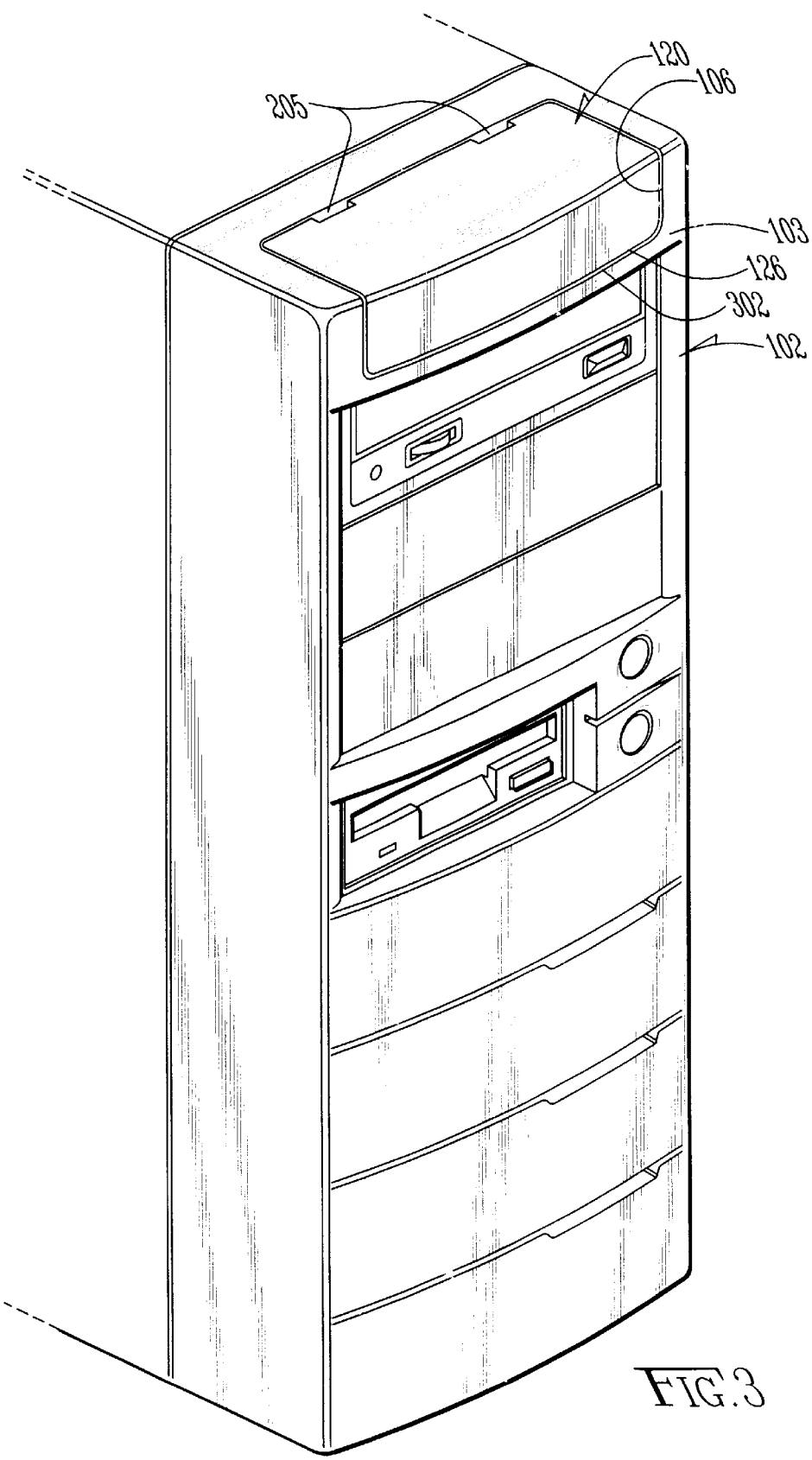
FIG. 3 is a perspective view of the system of the present invention with the differentiation plate disposed in a final fixed position.

Now referring to FIG. 3, there is shown a faceplate 102 with the differentiation plate 120 disposed over void 106, and in a final fixed position. A lower pivot point gap 302 is disposed along the joint between bottom edge 126 and front faceplate side 103. Gap 302 is adapted to partially receive the fulcrum protuberance 214.

In operation, the apparatus and method of the present invention as described in FIGS. 1–3, could function as follows:

The faceplate 102, with the removable plate 120 firmly coupled therein, is readily identifiable by the dissimilar colors between the faceplate 102 and the removable plate 120. The removable plate 120 can be removed and replaced as follows: tool 210 is engaged with faceplate 102. Front protuberance 212 is disposed in top gap 205 while the fulcrum protuberance is disposed in gap 302. Downward pressure is applied to the tool 210, causing the top gap 205 (FIG. 3) to increase and the removable plate 120 to pivot about its bottom edge 126. With further pressure on tool 210, the thin lip region 202 becomes free of the faceplate 102, and the removable plate is free to be removed easily. The insertion process of the removable plate 120 is as follows: Ears 128 and 130 are inserted into voids 108 and 110 respectively. Removable plate 120 is then rotated toward faceplate 102 so that the top gap 205 becomes smaller. Additional rotational force is applied to the removable plate 120 despite increasing resistance. When the removable plate snaps into place so that the top side 122 is flush with top faceplate side 104, the insertion process is complete. In this, the final fixed position, the removable plate 120 is extremely resistant to accidental or unintentional removal by any means.

Figure 4:
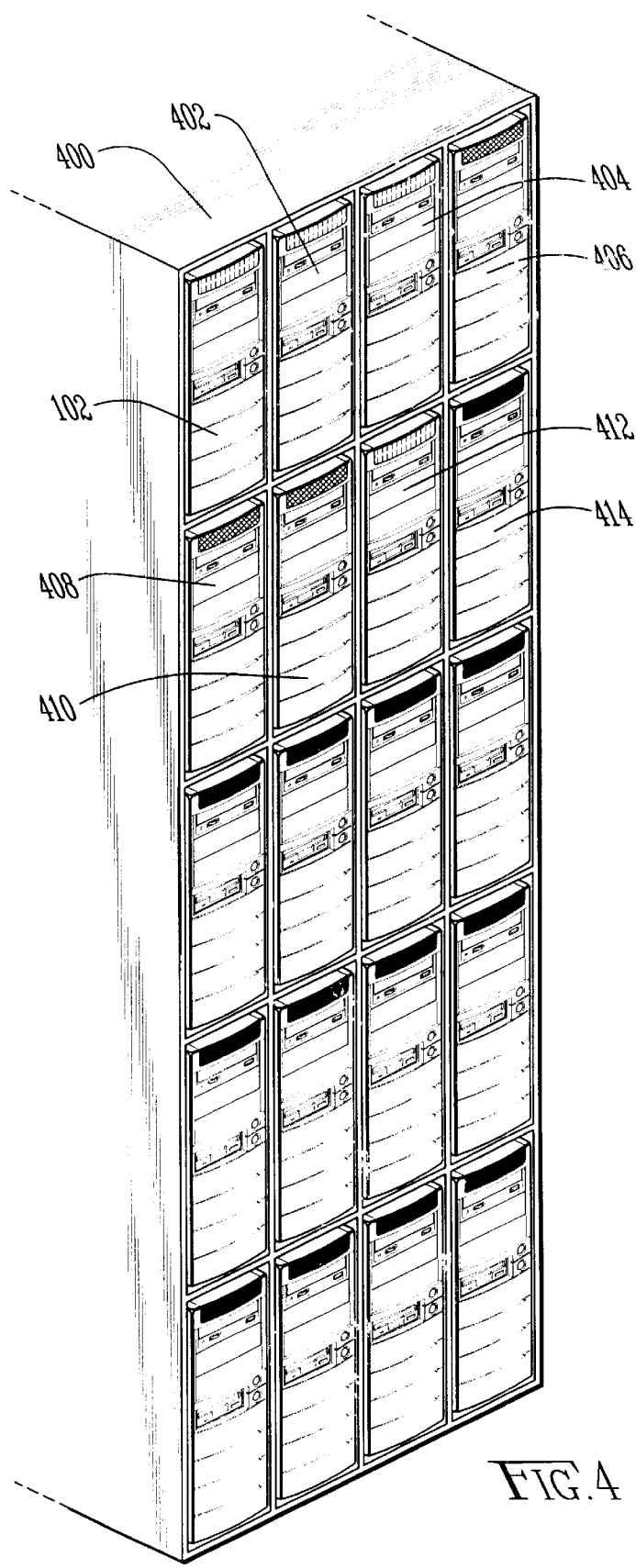
FIG. 4 is a front view of a rack of industrial computers having the differentiation plate of the present invention.

Now referring to FIG. 4, there is shown a rack 400 of industrial PCs, including a PC having faceplate 102, as well as PCs 402, 404, 406, 408, 410, 412, and 414, as well as several additional non-enumerated PCs. In this example, we will assume that each PC in the rack 400 is the same brand and size and that they have the same color of faceplate; we will assume it to be black for this discussion. Faceplate 102, as well as PCs 402 and 404, will be assumed to be used for administration of a network. Consequently, the removable panels of each of these PCs will be of the same color, assumed here to be purple. PCs 406, 408, 410, and the remainder of the non-enumerated PCs can be assumed to be primarily running application software for use by remote users. e.g., call center software for telemarketing, etc., and they would have a different color for the removable plate 120, e.g. yellow. PC 412 might be used as an email server and have yet a different colored removable plate therein. Now assume that the function of PC 414 has been changed from running an application software package to that used by a network server. If this is the case, then the yellow removable plate, for application PCs, would be replaced with a purple removable plate for network servers. Then, despite its physical separation from the other network servers, it can be readily identified as being associated with them. In the system of the present invention, each PC in the plurality of PCs in the rack which have differentiation plates of the same color will either include a circuit board or software file therein which is common to each other and also different from other PCs having differentiation plates of different colors. Thus the color of a differentiation plate indicates that a particular circuit board or software file is disposed in any given PC.

Throughout this description, reference is made to an industrial PC, because it is believed that the beneficial aspects of the present invention would be most readily apparent when used in connection with industrial PCs; however, it should be understood that the present invention is not intended to be limited to industrial PCs and should be hereby construed to include other non-industrial PCs as well.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

We claim:
1. An industrial PC comprising:
 a faceplate disposed on a housing of a PC, said faceplate having a predetermined first color characteristic;
 a differentiation plate having a predetermined second color characteristic removably disposed on said faceplate;
 wherein said first color characteristic and said second color characteristic are dissimilar;
 said rigid differentiation plate being coupled to said faceplate in a mechanical, non-adhesive coupling;
 wherein said differentiation plate is a rigid "L" shaped member having along one edge, ears for insertion into voids in said faceplate; and
 wherein said differentiation plate is removable from said faceplate by rotation around an interface line which exists between the faceplate and the differentiation plate along a bottom edge of the differentiation plate.

2. An industrial PC of claim 1 wherein said rotation around an interface line is assisted by a tool having a front protuberance thereon for insertion in a top gap between a top side of said differentiation plate and a top faceplate side of said faceplate.

3. An industrial PC of claim 2 wherein said top gap is above a lip region on an opposite end of said rigid "L" shaped member with respect to said ears and wherein said lip region is thinner in it smallest dimension with respect to a smallest dimension of all other portions of said differentiation plate.

4. A method of differentiating industrial computers disposed in a rack comprising the steps of:
 providing a first differentiation plate on a first industrial PC disposed in a rack, the first industrial PC having a first predetermined functional characteristic;
 providing a second differentiation plate on a second industrial PC disposed in the rack, the second industrial PC having a second predetermined functional characteristic;
 providing a third differentiation plate on a third industrial PC disposed in the rack, the third industrial PC having a third predetermined functional characteristic;

wherein said first and said second differentiation plate have an identical first color characteristic and said first and said second predetermined functional characteristic are identical;

wherein said third differentiation plate has a contrasting color characteristic which is non-identical with respect to said first color characteristic;

wherein said first, second, and third differentiation plates are removable;

wherein said first, second, and third differentiation plates are rigid;

wherein said first, second, and third differentiation plates are mechanically coupled to a PC through a non-adhesive interface; and wherein said first, second, and third differentiation plates are removable from a PC via a downward pivoting action.

5. A method of claim 4 wherein said downward pivoting action is inducted by a force applied by a tool having a protuberance thereon which extends into a gap between each of said first differentiation plates and a PC faceplate.

6. A method of claim 5 wherein said first differentiation plate is a smooth white surface.

7. A method of claim 6 further comprising the step of:
using a marker to generate identification information on said first differentiation plate.

* * * * *